US012185566B2

(12) United States Patent
Zhao et al.

(10) Patent No.: US 12,185,566 B2
(45) Date of Patent: Dec. 31, 2024

(54) DISPLAY PANEL, PREPARATION METHOD THEREOF AND DISPLAY APPARATUS

(71) Applicant: Yungu (Gu'an) Technology Co., Ltd., Langfang (CN)

(72) Inventors: Chengyu Zhao, Langfang (CN); Lei Mi, Langfang (CN); Zhimin Yan, Langfang (CN); Pinquan Xu, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 666 days.

(21) Appl. No.: 17/402,622

(22) Filed: Aug. 16, 2021

(65) Prior Publication Data
US 2021/0376293 A1   Dec. 2, 2021

Related U.S. Application Data

(63) Continuation of application No. PCT/CN2020/081524, filed on Mar. 27, 2020.

(30) Foreign Application Priority Data

Jul. 31, 2019  (CN) .......................... 201910703770.5
Nov. 15, 2019  (CN) .......................... 201911120612.3

(51) Int. Cl.
*H10K 50/844*   (2023.01)
*H10K 50/84*   (2023.01)
(Continued)

(52) U.S. Cl.
CPC .......... *H10K 50/844* (2023.02); *H10K 50/84* (2023.02); *H10K 59/00* (2023.02); *H10K 59/12* (2023.02);
(Continued)

(58) Field of Classification Search
CPC ............. H10K 50/844; H10K 59/1201; H10K 59/87; H10K 50/84; H10K 59/00; H10K 59/12; H10K 71/00
See application file for complete search history.

(56) References Cited

U.S. PATENT DOCUMENTS 9,437,660 B2   9/2016  Oh
10,418,430 B2  9/2019  Choi et al.
(Continued)

FOREIGN PATENT DOCUMENTS

CN   103824965   5/2014
CN   106887523   6/2017
(Continued)

OTHER PUBLICATIONS

Notification of First Office Action for Chinese corresponding Application No. 201911120612.3.
(Continued)

*Primary Examiner* — Britt D Hanley
*Assistant Examiner* — Victor V Barzykin
(74) *Attorney, Agent, or Firm* — KILPATRICK TOWNSEND & STOCKTON LLP

(57) ABSTRACT

Provided in the present application a display panel, including a substrate, wherein the substrate includes a display area, an aperture area, located in the display area; and a partition area, surrounding the aperture area and provided with at least one partition ring disposed around the aperture area, wherein a partition groove is disposed on at least one side of the partition ring, wherein the partition groove comprises a third partition groove, a first partition groove, and a second partition groove that are disposed on a side along a first direction away from the substrate in sequence, and communicated with each other, and the first partition groove is used to separate an organic material layer on a side wall of the
(Continued)

second partition groove from another organic material layer on a side of the third partition groove.

20 Claims, 8 Drawing Sheets

(51) Int. Cl.
   *H10K 59/00* (2023.01)
   *H10K 59/12* (2023.01)
   *H10K 59/122* (2023.01)
   *H10K 59/124* (2023.01)
   *H10K 59/80* (2023.01)
   *H10K 71/00* (2023.01)

(52) U.S. Cl.
   CPC ....... *H10K 59/1201* (2023.02); *H10K 59/122* (2023.02); *H10K 59/124* (2023.02); *H10K 59/87* (2023.02); *H10K 71/00* (2023.02)

(56) References Cited

U.S. PATENT DOCUMENTS

| | | | |
|---|---|---|---|
| 10,629,662 B2 | 4/2020 | Ding et al. | |
| 10,644,261 B2 | 5/2020 | Lee et al. | |
| 10,797,266 B2 | 10/2020 | Choi et al. | |
| 10,804,348 B2* | 10/2020 | Kim | H10K 71/00 |
| 10,978,526 B2* | 4/2021 | Qin | H10K 71/00 |
| 11,043,651 B2 | 6/2021 | Yu | |
| 11,245,093 B2 | 2/2022 | Sung et al. | |
| 2015/0076476 A1 | 3/2015 | Odaka et al. | |
| 2017/0148856 A1 | 5/2017 | Choi et al. | |
| 2017/0149014 A1 | 5/2017 | Choi et al. | |
| 2019/0051859 A1* | 2/2019 | Choi | H10K 59/123 |
| 2019/0074466 A1* | 3/2019 | Choi | H10K 71/60 |
| 2019/0081273 A1* | 3/2019 | Sung | H10K 50/80 |
| 2019/0148672 A1* | 5/2019 | Seo | H10K 50/856 257/40 |
| 2019/0157373 A1 | 5/2019 | Kim et al. | |
| 2019/0172898 A1 | 6/2019 | Choi | |
| 2020/0127215 A1 | 4/2020 | Wang et al. | |
| 2021/0193760 A1 | 6/2021 | Xie et al. | |
| 2021/0210569 A1 | 7/2021 | Zhang et al. | |

FOREIGN PATENT DOCUMENTS

| | | |
|---|---|---|
| CN | 107331790 | 11/2017 |
| CN | 107452894 A | 12/2017 |
| CN | 108666347 | 10/2018 |
| CN | 208094613 U | 11/2018 |
| CN | 109346617 | 2/2019 |
| CN | 109360843 | 2/2019 |
| CN | 109427861 | 3/2019 |
| CN | 109509769 | 3/2019 |
| CN | 109671870 A | 4/2019 |
| CN | 109742133 | 5/2019 |
| CN | 109742264 A | 5/2019 |
| CN | 109786427 A | 5/2019 |
| CN | 109801941 A | 5/2019 |
| CN | 109801956 | 5/2019 |
| CN | 109802052 | 5/2019 |
| CN | 109873022 | 6/2019 |
| CN | 109950277 | 6/2019 |
| CN | 109994522 A | 7/2019 |
| CN | 110034156 A | 7/2019 |
| CN | 110224006 A | 9/2019 |
| CN | 110429118 A | 11/2019 |
| CN | 110828519 A | 2/2020 |
| EP | 3441845 A1 | 2/2019 |
| EP | 3454389 A1 | 3/2019 |
| JP | 2019050180 A | 3/2019 |
| JP | 2019050189 A | 3/2019 |
| JP | 2019091039 A | 6/2019 |
| KR | 20160066240 A | 6/2016 |
| KR | 1020190018120 A | 2/2019 |
| WO | 2018196149 A1 | 11/2018 |

OTHER PUBLICATIONS

Notice of reasons for refusal of corresponding JP Application No. 2021-552633.
Extended European Search Report of corresponding EP Application No. 20847081.5.
Office Action of KR Patent Application No. 10-2021-7028635 Mailed Sep. 28, 2023.
International Search Report for Appl. No. PCT/CN2020/081524.
Notification of Taiwan First Office Action for corresponding Appl. No. 109111339.

* cited by examiner

DISPLAY PANEL, PREPARATION METHOD THEREOF AND DISPLAY APPARATUS

CROSS-REFERENCES TO RELATED APPLICATIONS

The present application is a continuation of International Application No. PCT/CN2020/081524, filed on Mar. 27, 2020, which claims priorities to Chinese Patent Application No. 2019107037705, filed on Jul. 31, 2019; and Chinese Patent Application No. 2019111206123, filed on Nov. 15, 2019. All the applications are incorporated by reference herein in their entireties for all purposes.

TECHNICAL FIELD

The present application belongs to the technical field of display devices, and specifically relates to a display panel, a method for manufacturing thereof, and a display device.

BACKGROUND OF THE INVENTION

With rapid development of display terminals, users have an increasingly high level of demands for screen ratio. Since components such as cameras, sensors, earpieces, etc. need to be installed on the top of the screen, a certain area on the top of the screen, such as the front bangs area of the screen of the Apple iPhone X, is usually reserved for installing the above components. Such configuration influences the overall consistency of the screen and thereby influencing the user experience. Currently, the full-screen display is receiving more and more attention in the industry as the full-screen display has a high screen ratio and a narrow frame, which significantly improves visual enjoyment of the users.

At present, in order to achieve a full screen display, a mounting hole is generally disposed in the display area of the display device (such as a mobile phone), and functional components such as cameras, sensors, or earpieces are disposed in the mounting holes. However, there is a risk of encapsulation failure for arranging the mounting hole in the display area, which in turn affects the display effect of the display panel.

BRIEF SUMMARY OF THE INVENTION

Therefore, the technical problem to be solved by the present application is that there is a risk of encapsulation failure for arranging a mounting hole in a display area, which in turn affects the display effect of a display panel, therefore, the present application further provides a display panel, a method for manufacturing the same and a display device.

A display panel of the present application comprises a display panel, comprising a substrate, wherein the substrate comprises: a display area, an aperture area, located in the display area; and a partition area; surrounding the aperture area and provided with at least one partition ring disposed around the aperture area, wherein a partition groove is disposed on at least one side of the partition ring, and the partition groove comprises a third partition groove, a first partition groove, and a second partition groove that are disposed on a side along a first direction away from the substrate in sequence, and communicated with each other, and the first partition groove is used to separate an organic material layer on a side wall of the second partition groove from another organic material layer on a side of the third partition groove.

A display device comprises the above display panel.

A method for manufacturing a display panel, comprises the following steps:

providing a substrate, comprising a display area, an aperture area located in the display area, and a partition area surrounding the aperture area;

forming an array structure layer on the substrate, presetting at least two metal sacrificial layers spaced apart along a direction parallel to the substrate in the partition area, and forming a second partition hole between adjacent metal sacrificial layers, so that the metal sacrificial layer is exposed on a side wall of the second partition hole;

removing the metal sacrificial layer to form at least one partition groove at least partially in the array structure layer;

forming an organic material layer on the array structure layer and in the partition groove, and the organic material layer is disconnected at a location where the metal sacrificial layer is removed.

The technical solution of the present application has the following advantages:

The display panel of the present application comprises a substrate, and the substrate comprises a display area; an aperture area located in the display area; and a partition area, provided with at least one partition ring disposed around the aperture area, and a partition groove is disposed on at least one side of the partition ring, and the partition groove comprises a first partition groove near the substrate, and a second partition groove away from the substrate; and the first partition groove is used to separate an organic material layer; the material of the first partition groove bottom is the same type as the material of the encapsulation layer that covers the interior of the partition groove and contacts with the partition groove bottom.

In the above-mentioned display panel, the organic material layer is partitioned by providing a partition groove, and the material of the first partition groove bottom and the material of the encapsulation layer covering the interior of the partition groove and contacting to the groove bottom are of the same type. On the one hand, the organic material layer is partitioned to improve the encapsulation effect, on the other hand, the adhesion of the film layer is improved, so that the inorganic film layers in the encapsulation layer and the inorganic film layer of the array structure layer are closely combined to further enhance the encapsulation effect and prevent water and oxygen outside from entering into the organic material layer in the display area from the aperture area, thus improving the encapsulation effect, service life and display effect of the display panel.

BRIEF DESCRIPTION OF THE DRAWINGS

In order to more clearly illustrate the specific embodiments of the application or the technical solutions in the prior art, the following will briefly introduce the drawings that need to be used in the specific embodiments or the description of the prior art. Obviously, the drawings in following description are the embodiments of the present application. For those of ordinary skill in the art, other drawings can be obtained based on these drawings without creative work.

DETAILED DESCRIPTION OF THE INVENTION

At present, in order to achieve a full screen display, a mounting hole is generally disposed in the display area of the display device (such as a mobile phone), and functional components such as cameras, sensors, or earpieces are disposed in the mounting hole. However, there is a risk of encapsulation failure for arranging the mounting hole in the display area, which in turn affects the display effect of the display panel. After research, the applicant found that it is mainly because that after installing the mounting hole in the display area, an organic material layer on a side wall of the mounting hole is exposed, and the exposed part of the organic material layer is more likely to be invaded by water and oxygen, which makes a planarization layer, insulating layer, hole injection layer, hole transport layer, organic light emitting layer, electron transport layer, electron injection layer or cathode layer and other organic material layers form a channel for water and oxygen to enter the display area, thus causing encapsulation failure of the display area, and affects the display effect of the display panel.

In view of the above technical problems, the present application provides a display panel and a method for preparing the same and a display device. The inventors has realized a partition of a water and oxygen entry channel by separating the organic material layer around the mounting hole, which can solve the above technical problem and prevent the encapsulation failure of the display area and ensure the display effect of the display panel.

Figure 1:
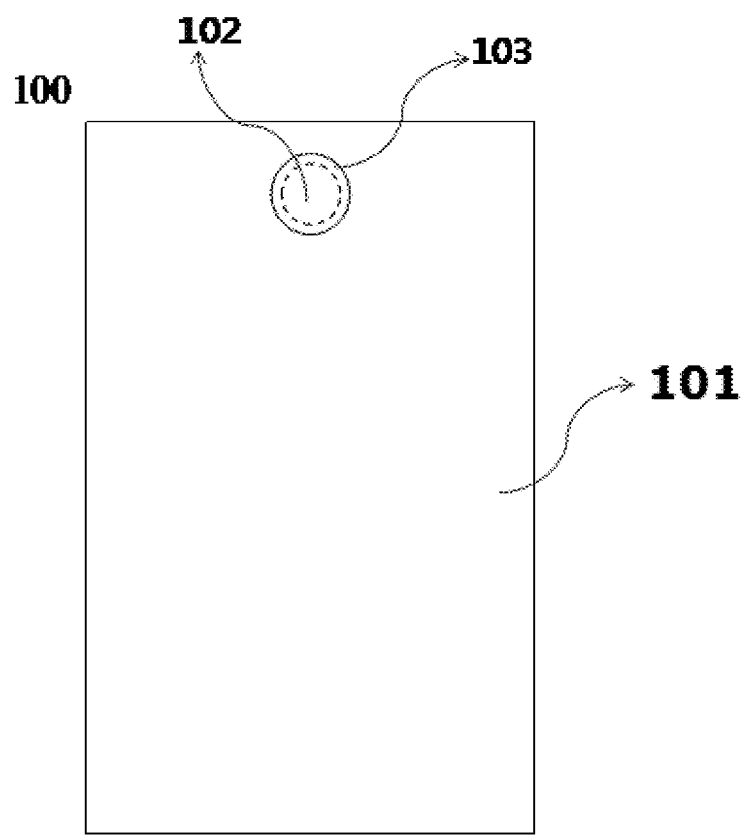
FIG. 1 is a schematic structural view of a display panel in the present application.

The present application provides a display panel. As shown in FIG. 1, the display panel 100 provided by the present application comprises a display area 101, an aperture area 102 located in the display area 101, and a partition area 103 surrounding the aperture area 102, wherein the aperture area 102 is provided with a mounting hole therein, and the mounting hole is used to mount functional elements such as a camera, a sensor or an earpiece, so as to increase a screen ratio and improve visual enjoyment of the user.

Figure 2:
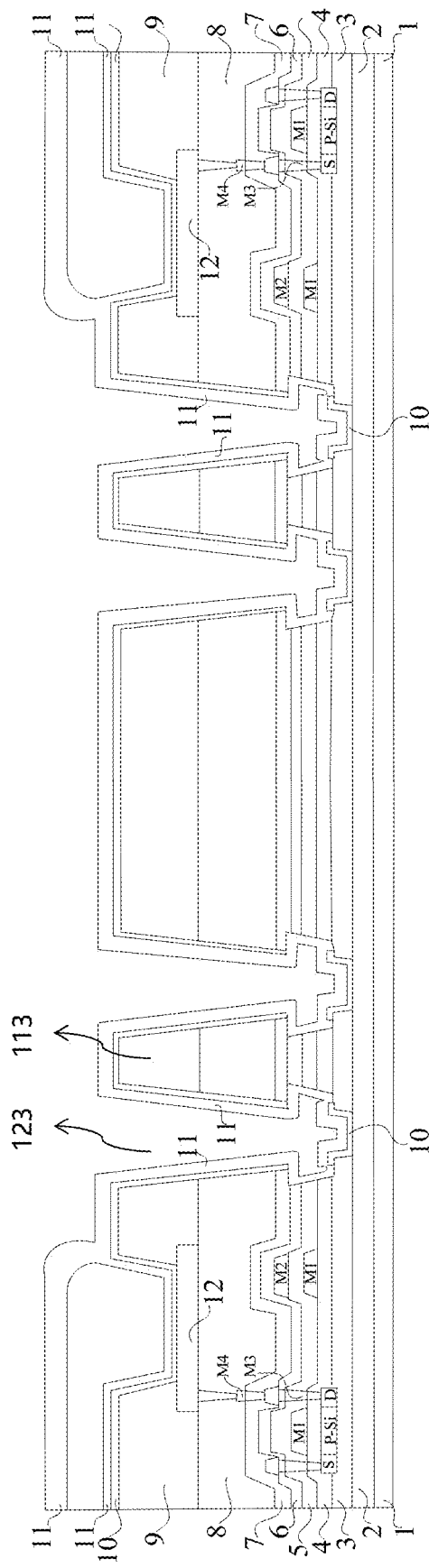
FIG. 2 is a schematic structural view of a display panel without an aperture area of the present application.
Figure 3:
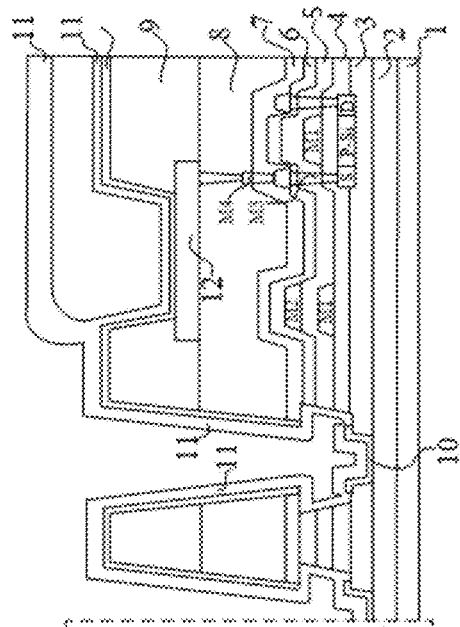
FIG. 3 is a schematic structural view of a display panel in FIG. 2 with an aperture area.
Figure 4:
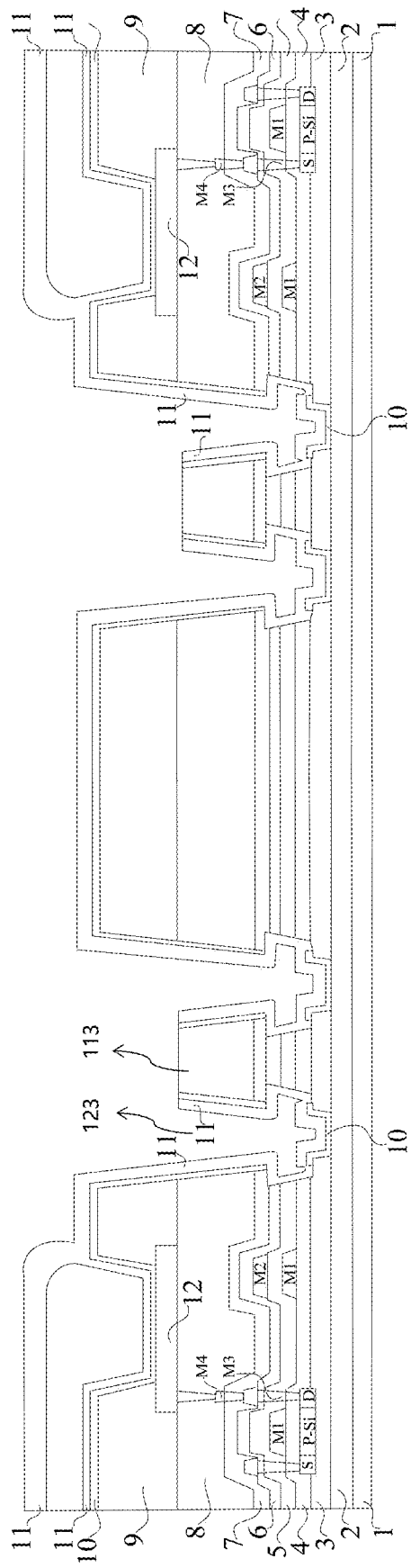
FIG. 4 is a schematic structural view of a display panel without an aperture area having a different partition ring from FIG. 2 of the present application.
Figure 5:
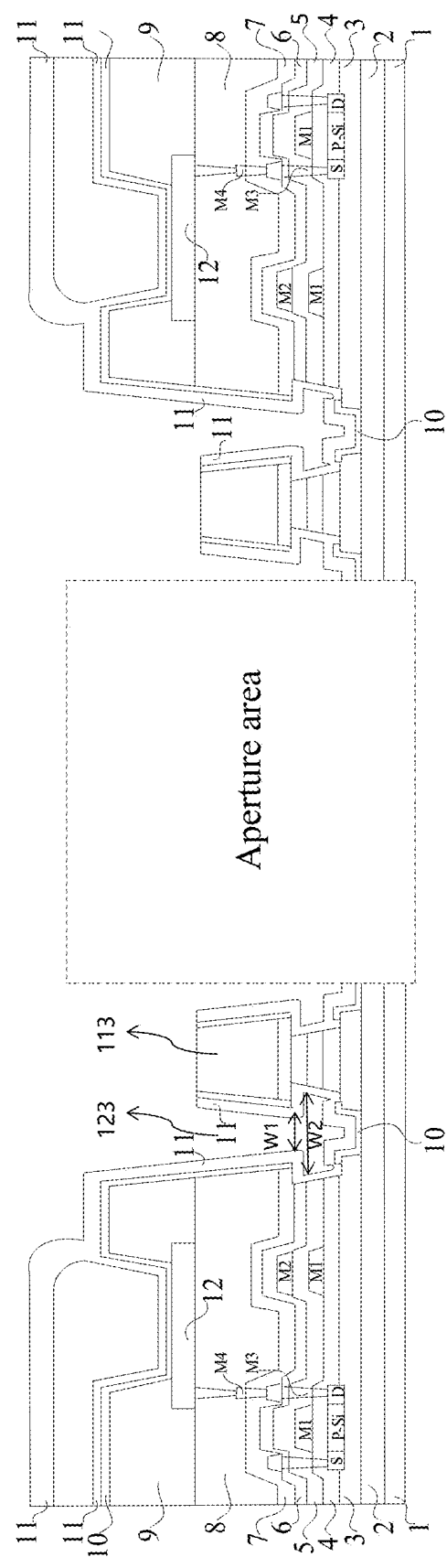
FIG. 5 is a schematic structural view of a display panel in FIG. 4 with an aperture area.

Optionally, as shown in FIG. 2 or 3, the display panel 100 comprises a substrate 1 wherein the substrate 1 comprises a display area 101, an aperture area 102 located in the display area 101, and a partition area 103 surrounding the aperture area 102; and the partition area 103 is provided with at least one partition ring 113, and a partition groove 123 is disposed on at least one side of the partition ring 113, and the partition groove comprises a third partition groove 1233, a first partition groove 1231, and a second partition groove 1232 that are disposed on a side along a first direction away from the substrate in sequence and communicated with each other. As shown in FIG. 3, the third partition grooves 1233, the first partition grooves 1231 and the second partition grooves 1232 are arranged in sequence on a surface of a side away from the substrate. The third partition groove 1233 is located near the substrate, the first partition groove 1231 is located on a side of the third partition groove 1233 away from the substrate, and the second partition groove 1232 is located at an uppermost position of the side of the first partition groove 1231 away from the third partition groove 1233. The first partition groove 1231 is used to separate an organic material layer 10 on the side wall of the second partition groove 1232 from another organic material layer on a side of the third partition groove 1233; the material at a bottom of the first partition groove 1231 and the material of the encapsulation layer 11 covering the interior of the partition groove 123 and contacting to the bottom of the third partition groove are of the same type.

Specifically, the first partition groove 1231 is formed before the preparation of the pixel defining layer, that is, the pixel defining layer is prepared after the preparation of the first partition groove 1231, so that the pixel defining layer is filled at the bottom of the first partition groove 1231, and the pixel defining layer can't be removed through an exposure process, which may cause that the organic material layer cannot be partitioned in subsequent evaporation of the organic material layer, and lead to encapsulation failure of the display panel. Based on this fact, the partition ring 113 can have a gourd shape, and a pixel defining layer is located at an upper layer of the partition ring 113, which prevents the first partition groove 1231 from being filled with organic film layer such as the pixel defining layer, and thus effectively isolating the organic material layer and improving encapsulation effect. In addition, a crack dam can be omitted through the setting of the partition ring, and a frame area of the aperture area can be reduced, therefore the screen ratio can be further increased.

Optionally, the substrate 1 comprises a first flexible layer, a first barrier layer, and a second flexible layer, and an array structure layer is formed on a side of the second flexible layer away from the first barrier layer. The first barrier layer arranged between the first flexible layer and the second flexible layer can improve the ability of the flexible substrate to block water and oxygen. Specifically, the first flexible layer and the second flexible layer comprises a material such as polyimide (PI), and the first flexible layer has a thickness of 8-12 preferably 10 and the second flexible layer has a thickness of 8-12 μm, preferably 10 μm. The first barrier layer is an inorganic layer, the inorganic layer comprises a material of silicon oxide (SiOx) or silicon nitride (SiNx) or other materials, and the first barrier layer has a thickness of 0.8-1.2 μm, preferably 1 μm. The setting of the thickness of the first barrier layer may not only optimize the effect of blocking external water or vapor, but also reduce a thickness of the display panel to achieve lightness and thinness.

In the above display panel, a partition groove 123 or a partition ring 113 is provided to separate the organic material layer on the side wall of the second partition groove from another organic material layer on the side of the third partition groove; the material at the bottom of the first partition groove 1231 and the material of the encapsulation layer covering the interior of the partition groove 123 and contacting to the bottom of the groove are of the same type, on the one hand, the organic light-emitting layer is partitioned to block water and oxygen from the entry channel, and improve the encapsulation effect of the display panel; on the other hand, an adhesion force of the film layer can be improved, so that the inorganic film layer in the encapsulation layer 11 and the inorganic film layer at the bottom of the partition groove 123 are closely bonded to further enhance an encapsulation effect and prevent external water and oxygen from entering the organic material layer in the display area 101 via the aperture area 102, and improve a encapsulation effect, service life and display effect of the display panel.

Optionally, in the display panel of the embodiment of the present application, the third partition groove 1233, the first partition groove 1231, and the second partition groove 1232 are arranged in sequence along a stacking direction that forms a certain angle with the display panel (for example, 75°, 80°, 90°, etc.).

Optionally, as shown in FIG. 3, in the embodiment of the present application, the example is described when the third partition groove 1233, the first partition groove 1231, and the second partition groove 1232 are arranged along the direction orthogonal to the substrate, which is not used to limit the present application.

In the direction orthogonal to the substrate, the first partition groove 1231 has a first opening away from the substrate 1, a diameter W2 of the first opening is larger than a diameter W1 of the groove opening on a side of the second partition groove 1232 near the substrate 1, the first partition groove 1231 has a second opening near the substrate, a diameter of the second opening is larger than a diameter of the groove opening on a side of the third partition groove 1233 away from the substrate; so that the organic material layer 10 is partitioned at the first partition groove 1231.

Figure 6:
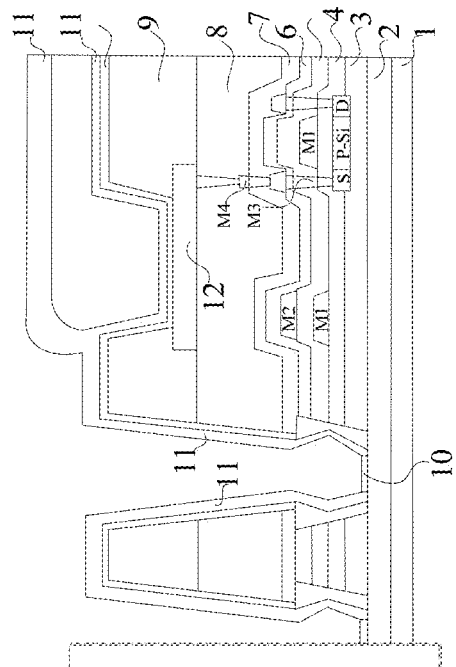
FIG. 6 is a schematic structural view of a display panel with an aperture area having a different partition groove from FIG. 5 of the present application.
Figure 6:
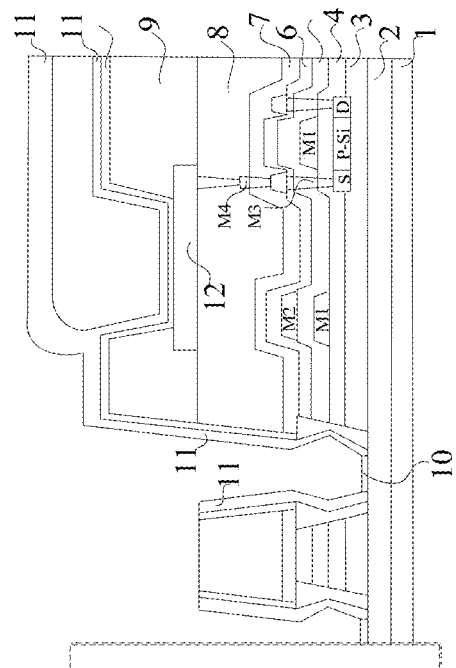

Optionally, as shown in FIG. 3 or FIG. 6, in the direction orthogonal to the substrate, the first partition groove 1231 has an inverted trapezoid shape or hexagon shape in cross section; an angle between each side wall of the first partition groove 1231, the second partition groove 1232 and the third partition grooves 1233 and respective bottom plane to which the side wall corresponds is larger than 90°. Specifically, when the partition groove is cut along an axis of the partition groove 123, in the cross section of the cut groove, an angle between a side wall of the section and the bottom wall of the section is larger than 90°. This structure arrangement is beneficial for forming a tightly adhered film on the side wall of the partition groove 123 when the inorganic layer of the encapsulation layer 11 is formed by a chemical vapor deposition (CVD) process, thereby improving the encapsulation effect.

Optionally, the partition groove 123 is an annular groove. The annular partition groove is arranged around the aperture area 102 to separate the organic material layer between the aperture area 102 and the display area 101, thereby partitioning the channel of water and oxygen entering the display area, and improving the service life and display effect of the display panel.

As shown in FIGS. 2-7, the aperture area 102 is provided with a mounting hole passing through the display panel 100 for mounting functional elements, a partition groove 123 is arranged around the mounting hole, and a partition ring 113 is disposed between the partition groove 123 and the mounting hole to separate the organic material layer 10 on the side wall of the second partition groove from another organic material layer 10 on the side of the third partition groove; specifically, the functional element may be a camera, a sensor, a microphone, an earpiece, or a physical button, etc.

Optionally, at least two partition rings 113 are arranged around the mounting hole. The partition ring 113 is a ring-shaped partition ring arranged around the mounting hole to separate the organic material layer 10 on the side wall of the second partition groove from another organic material layer 10 on the side of the third partition groove. By providing a plurality of partition rings, the organic material layer 10 can be better and more thoroughly partitioned to improve the encapsulation effect of the display panel.

Further, the display panel 100 further comprises an array structure layer disposed on the substrate 1, and at least part of the partition grooves 123 are disposed in the array structure layer.

Optionally, a buffer layer is arranged between the substrate 1 and the array structure layer, at least part of the partition groove 123 passes through the buffer layer, and the material of the encapsulation layer in contact with the groove bottom of the partition groove 123 is the same type as the material of the buffer layer; that is, the material of the buffer layer exposed at the bottom of the partition groove 123 is the same type as the material of a side of the encapsulation layer 11 near the substrate 1. For example, both of the material can be inorganic material including silicon nitride or silicon oxide. Such setting can not only partition the organic material layer, but also improve an adhesion force of the film layer, so that the inorganic film layer in the encapsulation layer 11 and the inorganic film layer of the buffer layer are closely bonded, which can enhance the encapsulation effect and prevent external water and oxygen from entering the organic material layer 10 in the display area 101 via the aperture area 102, and improve the encapsulation effect, service life and display effect of the display panel.

Further, as shown in FIG. 3, the buffer layer comprises a first inorganic layer 2 near the substrate 1 and a second inorganic layer 3 away from the substrate 1. The partition groove 123 passes through the second inorganic layer 3. The material of encapsulation layer 11 in contact with the bottom of the partition groove 123 is the same type as the material of the first inorganic layer 2; specifically, the material of the first inorganic layer 2 comprises silicon nitride ($SiN_x$), and the material of the second inorganic layer 3 comprises silicon oxide ($SiO_x$), by setting such two inorganic buffer layers, it can not only improve the encapsulation effect, but also contribute to heat insulation. At the same time, by setting such silicon nitride ($SiN_x$) layer, pollutants from the glass substrate, especially sodium ions, can be blocked, and leakage current caused by the pollutants can be avoided. In addition, by setting a silicon oxide ($SiO_x$) layer, a heat conduction loss in the excimer laser anneal (ELA) process can be avoided, which is beneficial to the formation of large crystal grains and reduces the interface defects of polysilicon.

Optionally, the encapsulation layer 11 is a thin-film encapsulation layer. The thin-film encapsulation layer comprises a third inorganic layer, an organic layer, and a fourth inorganic layer stacked in sequence. The fourth inorganic layer is near the organic material layer 10 and overlies the organic material layer 10. The material of the fourth inorganic layer and the material of the bottom of the partition groove 123 are of the same type; the third inorganic layer has a thickness of 0.8-1.2 μm, such as 1 μm, the organic layer has a thickness of 8-12 μm, such as 10 μm, the fourth inorganic layer has a thickness of 0.8-1.2 μm, such as 1 μm.

Preferably, the first inorganic layer, the second inorganic layer, the third inorganic layer and the fourth inorganic layer are all made of silicon oxide or silicon nitride. The inorganic layers can be used to improve the encapsulation effect while improving the adhesion force of the film layer.

Optionally, the organic material layer 10 comprises a hole injection layer, a hole transport layer, an organic light-emitting layer, an electron transport layer, and an electron injection layer that are stacked, and the hole injection layer is disposed on the array structure layer.

Optionally, as shown in FIG. 3, the array structure layer comprises a pixel circuit layer, a planarization layer, and a pixel defining layer. The pixel circuit layer forms respective film layers of a thin film transistor, such as a semiconductor layer (P-Si) formed on the second inorganic layer 3 of the buffer layer, a gate insulating layer 4 formed on the semiconductor layer, a capacitor insulating layer 5 located above the gate insulating layer 4, an interlayer dielectric layer 6 located above the capacitor insulating layer 5, and a planarization layer 8 located above the interlayer dielectric layer 6, and a pixel defining layer 9 located on the planarization layer 8. The pixel circuit layer comprises the source (S), drain (D) and gate (M1) in the thin film transistor (Thin Film Transistor, TFT), the gate (M1) is located between the gate insulating layer 4 and the capacitor insulating layer 5, the source (S) and drain (D) are in contact with the semiconductor layer (P-Si). A capacitor of the pixel circuit layer comprises a first plate (M1) and a second plate (M2). The first plate (M1) is located between the capacitor insulating layer 5 and the interlayer dielectric layer 6, and the second plate (M2) is located between the gate insulating layer 4 and the capacitor insulating layer 5.

The display panel further comprises a first electrode and a second electrode. The first electrode is an anode. The first electrode comprises material such as silver-doped indium tin oxide, or silver-doped indium zinc oxide, or indium zinc oxide or indium tin oxide. The first electrode uses silver-doped indium tin oxide or silver-doped indium zinc oxide to reduce a resistance of the first electrode. Optionally, the first electrode is a composite film layer of indium tin oxide and silver. For example, the first electrode comprises a three-layer composite film layer of indium tin oxide, silver and indium tin oxide; and the middle layer is configured as a silver layer, which can increase the conductivity of the first electrode. The second electrode is a cathode, and the second electrode is made of magnesium or silver.

The present application also provides a display device including any of the above-mentioned display panels. For example, the display device can be a mobile phone, a television, a tablet, a computer, or a camera.

The present application also provides a method for manufacturing a display panel, as shown in FIGS. 9a-9e, including the following steps:

S10 providing a substrate comprising a display area, an aperture area located in the display area, and a partition area surrounding the aperture area;

S20 forming an array structure layer on the substrate;

S30 in the partition area, forming at least one partition groove at least partially located in the array structure layer;

S40 forming an organic material layer on the array structure layer and in the partition groove, and the organic material layer is disconnected at the partition groove;

S50 forming an encapsulation layer on a side of the organic material layer away from the substrate, the encapsulation layer covers an inner wall of the partition groove, the material at a bottom of the partition groove is the same as the material of the encapsulation layer covering the interior of the partition groove and contacting to a bottom of the groove.

The display panel prepared by the above preparation method, on the one hand, a partition groove and a partition ring can be formed between the aperture area and the display area to realize a partition of the organic light-emitting layer between the aperture area and the display area, thereby blocking water and oxygen from entering and improve the encapsulation layer; on the other hand, the material at a bottom of the partition groove is the same type as the material of the encapsulation layer covering the interior of the partition groove and contacting to a bottom of the groove, for example, the material at the bottom of the partition groove is an inorganic material, and the material covering the interior of the partition groove and the material of the encapsulation layer in contact with the bottom of the groove are also an inorganic material, and the two materials are of the same type such as silicon nitride ($SiN_x$) or silicon oxide ($SiO_x$), which can improve an adhesion force of the film layer, make the bottom of the groove and the encapsulation layer more tightly bonded, and further improve the encapsulation effect, and the inorganic material can effectively block water and oxygen, and ensure service life and display effect of the display panel.

As explained in the above technical solution, the inventor found that when preparing the mounting hole in the display area, the reason why the organic material layer in the aperture area cannot be effectively disconnected is mainly because the organic material layer such as the pixel defining layer can be filled in the first partition groove during the preparation process, which is difficult to be removed through an exposure process. During subsequent evaporation of the organic material layer, the organic material layer cannot be partitioned, which affects the actual encapsulation effect and display effect of the display panel. Therefore, the inventors firstly stacked an array structure layer on the substrate, and then formed a partition groove passing through the array structure layer. In a direction orthogonal to the substrate, the partition groove comprises a third partition groove 1233, the first partition groove 1231 and the second partition groove 1232, which are located on the side along a first direction away from a surface of the substrate in sequence and communicated with each other. Specifically, the third partition groove 1233, the first partition groove 1231, and the second partition groove 1232 are arranged in sequence along a surface away from the substrate. The third partition groove 1233 is arranged near the substrate. The partition groove 1231 is located at a side of the third partition groove 1233 away from the substrate, and the second partition groove 1232 is located at a side of the first partition groove 1231 away from the third partition groove 1233, and arranged at an uppermost position. the first partition groove 1231 has the first opening away from the substrate, a diameter of the first opening is larger than a diameter of the groove opening on the side of the second partition groove near the substrate, that is, a groove wall of the first partition groove 1231 is recessed inward to make the organic material layer partitioned at the first partition groove 1231. Optionally, the first partition groove 1231 in the present application is formed after forming the pixel defining layer, which can prevent the pixel defining layer from entering the first partition groove 1231, therefore, when the mounting hole is prepared, the organic material layer in the aperture area is disconnected, which can prevent water and oxygen from entering the display area via the aperture area, and improve the encapsulation effect, service life and display effect of the display panel.

Figure 9A:
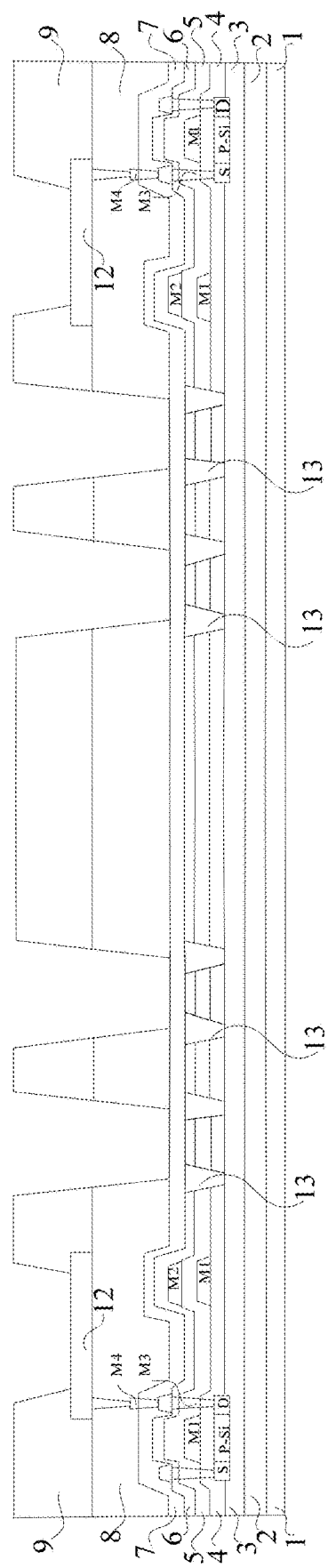
FIGS. 9a-9e are schematic structural views of a process for manufacturing a display panel of the present application.
Figure 9B:
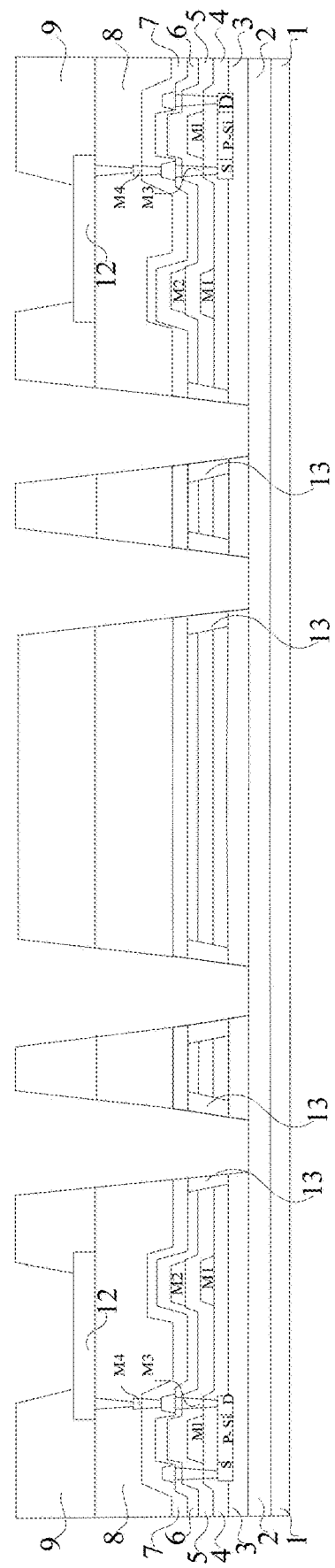
Figure 9C:
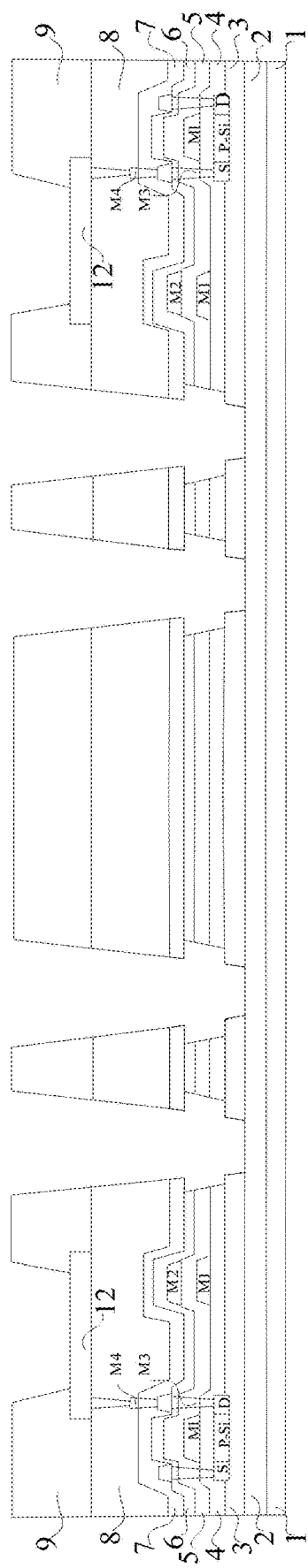

Further, the step of forming at least one partition groove at least partially located in the array structure layer in the partition area comprises:

A hole is punched in the array structure layer located in the partition area to form at least one first partition hole, and the first partition hole is filled with a metal material to form a metal sacrificial layer 13; a planarization layer 8 is formed on the array structure layer. As shown in FIGS. 9a and 9b, the planarization layer 8 and part of the metal sacrificial layer 13 are etched to expose part of the metal sacrificial layer 13 to form a second partition hole 14. Further, as shown in FIG. 9c, in the second partition hole 14, the remaining material of the metal sacrificial layer 13 is removed to form a partition groove 123 for partitioning the organic material layer 10, so that the organic material layer 10 is disconnected at a position where the metal sacrificial layer 13 is removed. The preparation of the partition groove 123 can be achieved through the above process, which can simplify the process and reduce the effects on the display panel.

Optionally, removing the remaining metal sacrificial layer 13 to form the partition groove 123 can be achieved by a wet etching process. Other film layers will not be affected while removing the remaining metal sacrificial layer, which ensures reliability of the display panel.

Further, in the direction orthogonal to the substrate, the partition groove 123 comprises a first partition groove 1231 near the substrate 1 and a second partition groove 1232 away from the substrate 1. A diameter W2 of the first opening on one side of the first partition groove 1231 away from the substrate 1 is larger than the diameter W1 of the groove opening on the side of the second partition groove 1232 near the substrate 1, that is, a size difference is formed between the first partition groove 1231 and the second partition groove 1232, so that the organic material layer is partitioned at the first partition groove 1231.

Figure 9D:
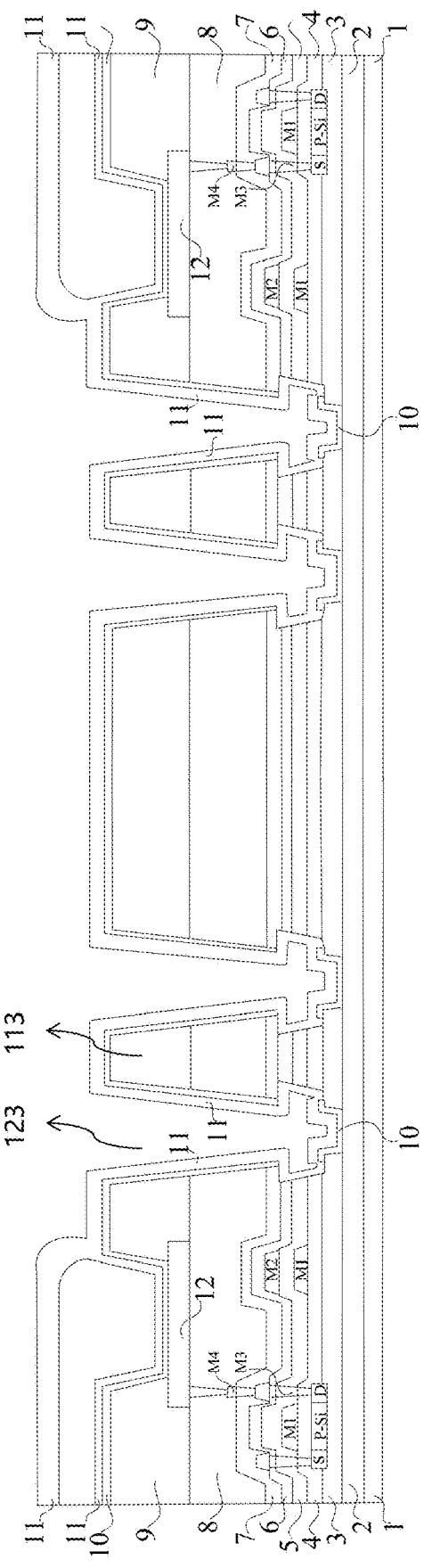

Optionally, as shown in FIG. 9d, along the stacking direction from the substrate to the encapsulation layer, the first partition groove 1231 has an inverted trapezoid shape in cross section. The angle between a sidewall of the first partition groove 1231 and the bottom of the partition groove can be larger than 90°, so that the encapsulation layer can be in close contact with the groove wall of the partition groove, which increases the adhesion force of the film layer and improves the encapsulation effect.

Optionally, before forming the second partition hole 14, the method further comprises:

A pixel defining layer 9 is formed on the planarization layer 8 located in the partition area; the pixel defining layer 9 and the planarization layer 8 and part of the metal sacrificial layer 13 are etched to expose part of the metal sacrificial layer 13 to form a second partition hole 14, which can be used to avoid that the organic material layer can't be effectively partitioned as the material of the pixel defining layer is deposited in the partition groove.

Optionally, a partition ring 113 is formed between adjacent partition grooves 123 to separate the organic material layer 10 on the side wall of the second partition groove from another organic material layer 10 on the side of the third partition groove.

Preferably, the metal sacrificial layer comprises a material such as titanium and/or aluminum.

Optionally, the metal sacrificial layer can be formed by a separate process, or can be formed in the same process step with the metal layer of the array structure layer. The metal layer in the array structure layer may comprise a electrode layer (a first electrode or a second electrode in a capacitor, or the gate electrode, etc.) or a wiring layer (data line or scan line).

Figure 7:
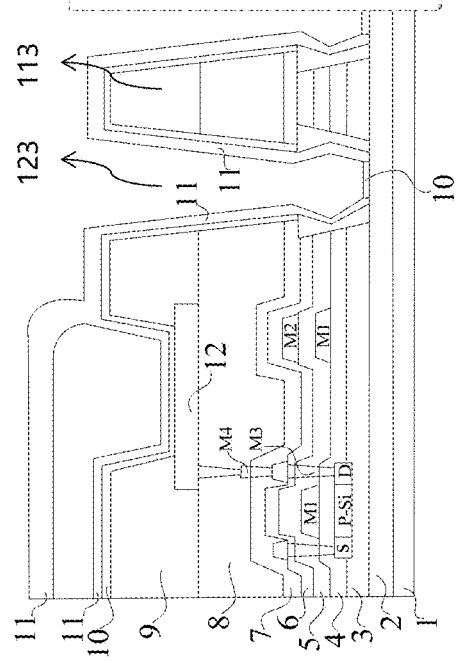
FIG. 7 is a schematic structural view of a display panel with an aperture area having a different partition ring from FIG. 6 of the present application.
Figure 7:
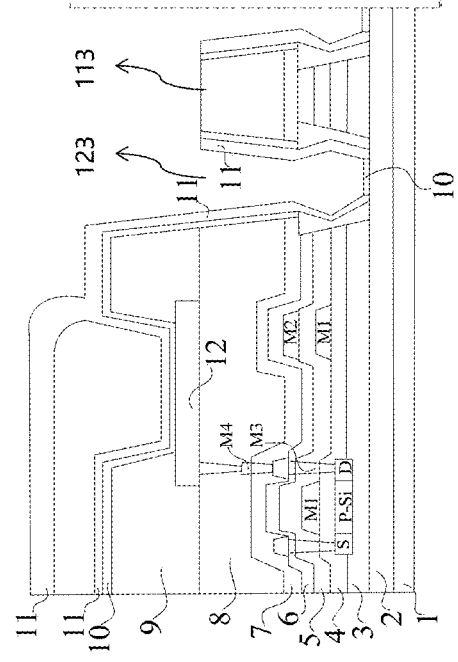
Figure 8:
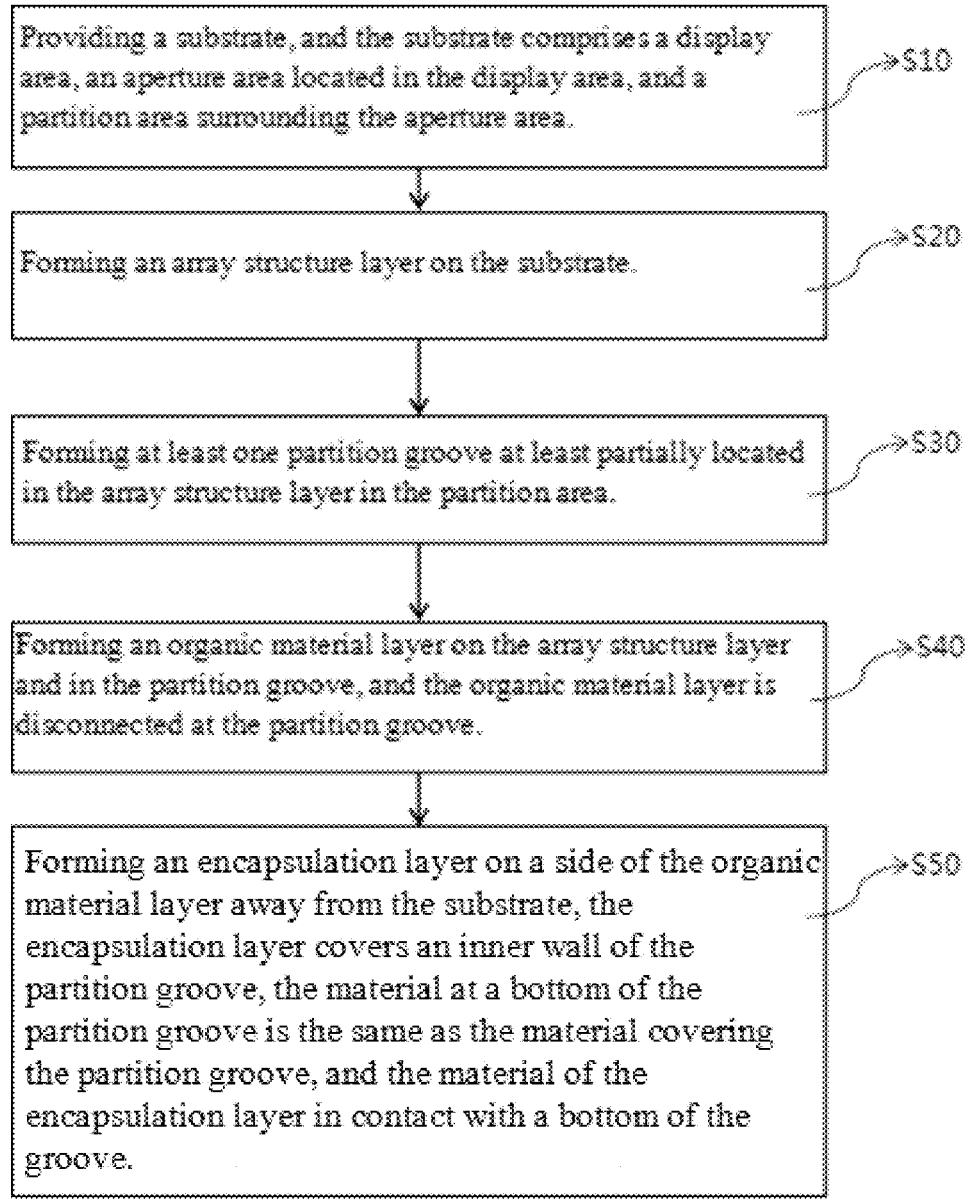
FIG. 8 is a flowchart of a method for manufacturing a display panel of the present application.

Optionally, the step of forming at least one partition groove at least partially located in the array located in the structure layer of the partition area comprises the following:

A hole is punched in the array structure layer located in the partition area to form at least one first partition hole, and the first partition hole is filled with a metal material to form a metal sacrificial layer 13; a planarization layer 8 is formed on the array structure layer; the material of the planarization layer 8 and part of the metal sacrificial layer 13 are etched to expose part of the metal sacrificial layer 13 to form a second partition hole 14; part of the metal sacrificial layer 13 is removed to form a partition groove 123 for partitioning the organic material layer. Through the process, the partition groove can also be formed to achieve the partition of the organic material layer and improve the encapsulation effect; at the same time, the material of part of the metal sacrificial layer is removed to form a partition groove. As shown in FIG. 6 or 7, in a direction orthogonal to the substrate, the partition groove 123 comprises a first partition groove 1231 near the substrate 1 and a second partition groove 1232 away from the substrate 1; a maximum diameter of the first partition groove 1231 is larger than a diameter of the groove opening on the side of the second partition groove 1232 near the substrate 1, so that the organic material layer 10 is partitioned at the first partition groove 1231. Specifically, along the stacking direction of the substrate 1 to the encapsulation layer 11, the first partition groove 1231 has a hexagon shape in cross section, and an angle between the side wall of the partition groove 123 connected to the bottom of the partition groove 123 and a bottom-located plane of the partition groove 123 is larger than 90°. At this time, the metal sacrificial layer comprises a three-layer structure, for example, the three-layer structure comprise materials of titanium/aluminum/titanium (Ti/Al/Ti), through selecting different etching rate, an etching rate of the aluminum metal layer is larger than that of the titanium metal layer, so that the first partition groove 1231 has a hexagonal shape in cross section, and a sidewall of the partition groove 123 connected to the bottom of the partition groove 123 and a bottom-located plane of the partition groove 123 is larger than 90° with, which can effectively improve the encapsulation effect and prevent the intrusion of water and oxygen.

Optionally, before forming the second partition hole 14, the method further comprises the following:

A pixel defining layer 9 is formed on the planarization layer 8 located in the partition area; the pixel defining layer 9 and the planarization layer 8 and part of the metal sacrificial layer 13 are etched to expose part of the metal sacrificial layer 13 to form a second partition hole 14, which can be used to avoid that the organic material layer can't be effectively partitioned as the material of the pixel defining layer is deposited in the partition groove.

Furthermore, a partition ring 113 is formed between adjacent partition grooves 123 to separate the organic material layer 10 on the side wall of the second partition groove from another organic material layer 10 on the side of the third partition groove, which can also have the effect of blocking cracks.

Optionally, the metal sacrificial layer 13 comprises materials of titanium and/or aluminum. Preferably, the first partition groove is filled with titanium, aluminum and titanium in sequence to form a metal sacrificial layer with a three-layer structure comprising a titanium layer, an aluminum layer and a titanium layer.

Further, the metal sacrificial layer and a metal lead layer of the array structure layer are formed in the same process step. The metal leads include scan lines and data lines.

Further, as shown in FIG. 2, the method further comprises the following:

A buffer layer is formed on the substrate, and at least a part of the partition groove 123 passes through the buffer layer.

Preferably, the buffer layer comprises a first inorganic layer 2 near the substrate 1 and a second inorganic layer 3 away from the substrate 1. The partition groove 123 passes through the second inorganic layer 3; that is, the first inorganic layer 2 is exposed at a bottom of the partition groove and the encapsulation layer 11 is in direct contact with the first inorganic layer 2, which can improve the film adhesion force.

Figure 9E:
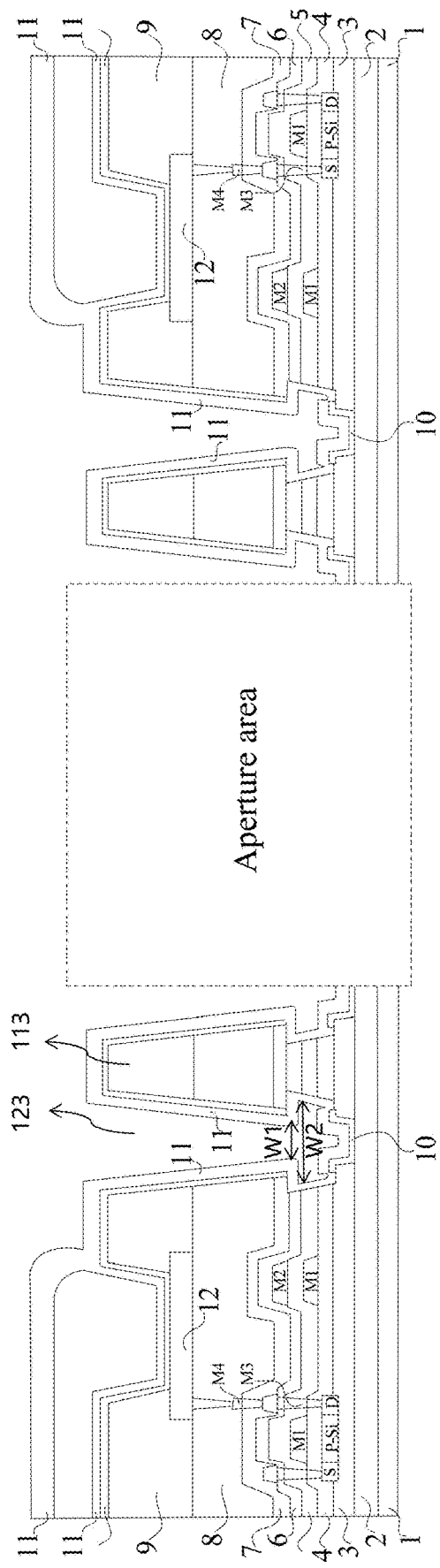

Preferably, the method for manufacturing the display panel 100 further comprises: as shown in FIG. 9e, after the encapsulation layer 11 is prepared, a mounting hole passing through the display panel is arranged in the aperture area 102 of the display panel 100 for mounting functional components, such as a camera, or earpiece, etc.

As shown in FIG. 3, the array structure layer comprises a semiconductor layer (P-Si) on the second inorganic layer 3 of the buffer layer, a gate insulating layer 4 on the semiconductor layer, a capacitor insulating layer 5 on the gate insulating layer 4, an interlayer dielectric layer 6 on the capacitor insulating layer 5, a planarization layer 8 on the interlayer dielectric layer 6, and a pixel defining layer 9 on the planarization layer 8 that are stacked. The pixel circuit layer comprises a source (S), drain (D) and gate (M1) in the thin film transistor (Thin Film Transistor, TFT). The gate (M1) is located between the gate insulating layer 4 and the capacitor insulating layer 5, the source (S) and drain (D) are in contact with the semiconductor layer (P-Si) layer. The capacitor of the pixel circuit layer comprises a first plate (M1) and a second plate (M2). The first plate (M1) is located between the capacitor insulating layer 5 and the interlayer dielectric layer 6, and the second plate (M2) is located between the gate insulating layer 4 and the capacitor insulating layer 5. The semiconductor layer is made of P-Si or α-Si, and has a thickness of 45-55 nm; the gate insulating layer 4 has a thickness of 95-105 nm, and is made of silicon oxide or zirconium oxide; the gate (M1) has a thickness of 245-255 nm, and the capacitor insulating layer 5 has a thickness of 95-105 nm. The pixel circuit is used to drive the organic light emitting device to emit light.

An anode 12 is formed on the planarization layer 8, a pixel defining layer 9 is formed on the planarizing layer 8 and the anode 12 located in the display area, and the pixel defining layer 9 is etched to expose at least part of the anode 12 to form a pixel opening, in which an organic material layer is prepared and a cathode is formed on the organic material layer. Optionally, the pixel defining layer 9 may be or may not be formed on the planarization layer located in the partition area; the display panel also comprises a spacer (SPC) arranged on the pixel defining layer 9 with a height of 1400-1600 nm, preferably 1500 nm, and used to support a mask when the organic light-emitting material is evaporated.

In the display panel and the a method for preparing the same and the display device provided in the present application, the display panel has a mounting hole for mounting functional elements such as a camera, a partition ring and a partition groove are arranged around the mounting hole, and the partition of the organic material layer between the aperture area and display area can be achieved through the partition ring and the partition groove, so as to prevent water and oxygen from entering the display area of the display panel, and improves the service life and display effect of the display panel. In addition, the setting of the partition groove can also function to prevent cracks.

What is claimed is:

1. A display panel, comprising a substrate, wherein the substrate comprises:
   a display area,
   an aperture area, located in the display area; and
   a partition area, surrounding the aperture area and provided with at least one partition ring disposed around the aperture area, wherein a partition groove is disposed on at least one side of the partition ring,
   wherein the partition groove comprises a third partition groove, a first partition groove, and a second partition groove that are disposed on a side along a first direction away from the substrate in sequence, and in communication with each other, and
   the first partition groove is used to disconnect an organic material layer on a side wall of the second partition groove from another organic material layer on a side of the third partition groove,
   the partition ring has a gourd shape, and a pixel defining layer is located at an upper layer of the partition ring.

2. The display panel of claim 1, wherein,
   the first direction is orthogonal to the substrate, and
   the first partition groove has a first opening away from the substrate, a width of the first opening is larger than a width of a groove opening on the side of the second partition groove near the substrate, and
   the first partition groove has a second opening near the substrate, a width of the second opening is larger than a width of a groove opening on the side of the third partition groove away from the substrate.

3. The display panel of claim 1, wherein,
   the first partition groove has an inverted trapezoid shape or a hexagon in cross section in a direction orthogonal to the substrate; and
   an angle between a side wall and a bottom-located plane of each of the first partition groove, the second partition groove and the third partition groove is larger than 90°.

4. The display panel according to claim 1, wherein,
   a mounting hole extending through the display panel is disposed in the aperture area, and used for mounting functional elements, and
   the partition groove is arranged around the mounting hole, and the partition ring is arranged between the partition groove and the mounting hole to separate the organic material layer on the side wall of the second partition groove from another organic material layer on the side of the third partition groove.

5. The display panel of claim 4, wherein
   at least two partition rings are disposed around the mounting hole to separate the organic material layer on the side wall of the second partition groove from another organic material layer on the side of the third partition groove.

6. The display panel according to claim 1, wherein,
   the display panel further comprises an array structure layer disposed on the substrate, and the partition groove is at least partially disposed inside the array structure layer.

7. The display panel of claim 6, further comprising
   a buffer layer provided between the substrate and the array structure layer, the partition groove at least partially passing through the buffer layer, and
   an encapsulation layer which is in contact with a bottom of the partition groove comprising a material same as that of the buffer layer.

8. The display panel of claim 7, wherein,
the buffer layer comprises a first inorganic layer adjacent to the substrate,
a second inorganic layer is disposed away from the substrate, the partition groove extends through the second inorganic layer, and
the encapsulation layer comprises a material same as that of the first inorganic layer.

9. The display panel according to claim 8, wherein,
the encapsulation layer is a thin-film encapsulation layer and comprises a third inorganic layer, an organic layer, and a fourth inorganic layer stacked in sequence, and
the fourth inorganic layer is close to the organic material layer and overlies the organic material layer, and the fourth inorganic layer comprises a material same as that of the bottom of the partition groove.

10. A display device, comprising the display panel according to claim 1.

11. A method for manufacturing a display panel, comprising the following steps:
providing a substrate, comprising a display area, an aperture area located in the display area, and a partition area surrounding the aperture area;
forming an array structure layer on the substrate, presetting at least two metal sacrificial layers spaced apart along a direction parallel to the substrate in the partition area, and forming a second partition hole between adjacent metal sacrificial layers, the metal sacrificial layer is exposed on a side wall of the second partition hole;
removing the metal sacrificial layer to form at least one partition groove at least partially in the array structure layer;
forming an organic material layer on the array structure layer and in the partition groove, and the organic material layer is disconnected at a location where the metal sacrificial layer is removed.

12. The method of claim 11, wherein,
the metal sacrificial layer is formed by the step of:
punching a hole in the array structure layer located in the partition area to form at least one first partition hole, which is filled with a metal material to form the metal sacrificial layer.

13. The method of claim 12, wherein,
the step of exposing the metal sacrificial layer comprises:
forming a planarization layer on the array structure layer;
etching materials of the planarization layer and part of the metal sacrificial layer to expose part of the metal sacrificial layer to form a second partition hole.

14. The method according to claim 13, before forming the second partition hole, further comprising:
forming a pixel defining layer on the planarization layer located in the partition area;
etching the pixel defining layer, the planarization layer, and part of the metal sacrificial layer material to expose part of the metal sacrificial layer to form a second partition hole.

15. The method according to claim 11, wherein,
a partition ring is formed between adjacent partition grooves.

16. The method according to claim 11, wherein,
the metal sacrificial layer comprises materials of titanium and/or aluminum.

17. The method of claim 12, wherein,
the metal sacrificial layer and a metal wiring layer of the array structure layer are formed in the same process step.

18. The method according to claim 11, further comprising:
forming a buffer layer on the substrate, and at least part of the partition groove passing through the buffer layer.

19. The method according to claim 18, wherein,
the buffer layer comprises a first inorganic layer near the substrate and a second inorganic layer away from the substrate, and
the partition groove passes through the second inorganic layer.

20. The method of claim 18, further comprising, after preparing the encapsulation layer, setting a mounting hole passing through the display panel in the aperture area of the display panel for mounting functional components.

* * * * *